(12) United States Patent
Haddon et al.

(10) Patent No.: US 10,490,291 B1
(45) Date of Patent: Nov. 26, 2019

(54) MEMORY CHECK ASIC FOR FUZES AND SAFETY AND ARMING DEVICES

(71) Applicant: The United States of America, as represented by the Secretary of the Navy, Arlington, VA (US)

(72) Inventors: Michael Haddon, Ridgecrest, CA (US); Jonathan Duncan, Ridgecrest, CA (US)

(73) Assignee: The United States of America, as Represented by the Secretary of the Navy, Washington, DC (US)

( * ) Notice: Subject to any disclaimer, the term of this patent is extended or adjusted under 35 U.S.C. 154(b) by 16 days.

(21) Appl. No.: 15/961,361

(22) Filed: Apr. 24, 2018

(51) Int. Cl.
G11C 16/34 (2006.01)
F42C 15/40 (2006.01)
G11C 16/32 (2006.01)

(52) U.S. Cl.
CPC .......... *G11C 16/3436* (2013.01); *F42C 15/40* (2013.01); *G11C 16/32* (2013.01)

(58) Field of Classification Search
None
See application file for complete search history.

(56) References Cited

U.S. PATENT DOCUMENTS 5,826,075 A * 10/1998 Bealkowski ........ G06F 11/1433
713/187
8,151,708 B2 4/2012 Ritchie
8,321,731 B2 11/2012 Taylor et al.
2015/0278151 A1 * 10/2015 Tang ................... G06F 12/0246
711/103

OTHER PUBLICATIONS

Department of Defense, Design Criteria Standard, MIL-STD-1316E, United States, Jul. 10, 1998.
Department of Defense, Joint Ordnance Test Procedure (JOTP), Technical Manual for the Use of Logic Devices in Safety Features, United States, Feb. 10, 2012.
Steele, National Defense Industrial Association, CRC-16 Check on Flash Based Logic Devices in the Implementation of Safety Features, United States, May 16, 2012.

* cited by examiner

*Primary Examiner* — Douglas King
(74) *Attorney, Agent, or Firm* — Naval Air Warfare Center Weapons Division; Jimmy M. Sauz

(57) ABSTRACT

A memory check ASIC for fuzes and safety and arming (S&A) devices. The memory check ASIC may comprise: an ASIC, data line, clock line, shutdown line, and reset line. The ASIC may operatively couple to a microcontroller having a flash-based memory and may comprise: a digital logic for verifying a calculated checksum based on contents of the flash-based memory. A clock signal along with the calculated checksum may be transmitted to the ASIC via the clock line and data line, respectively. A shutdown signal may be transmitted from the ASIC to the microcontroller via the shutdown line in response to the verification of the calculated checksum by the digital logic. A reset signal may synchronize sampling of the calculated checksum and may be latched by flip-flop circuits of the digital logic for a predetermined number of clock cycles.

2 Claims, 11 Drawing Sheets

US 10,490,291 B1

MEMORY CHECK ASIC FOR FUZES AND SAFETY AND ARMING DEVICES

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefor.

FIELD OF USE

The present disclosure relates generally to memory verification for flash-based memory in safety critical applications, and more particularly, to application specific integrated circuits (ASIC) used to verify on-chip memory in microcontrollers for fuzes and safety and arming (S&A) devices.

BRIEF DESCRIPTION OF THE DRAWINGS

The drawings are illustrative embodiments. They do not illustrate all embodiments. They do not set forth all embodiments. Other embodiments may be used in addition or instead. Details, which may be apparent or unnecessary, may be omitted to save space or for more effective illustration. Some embodiments may be practiced with additional components or steps and/or without all of the components or steps, which are illustrated. When the same numeral appears in different drawings, it is intended to refer to the same or like components or steps.

Figure 1:
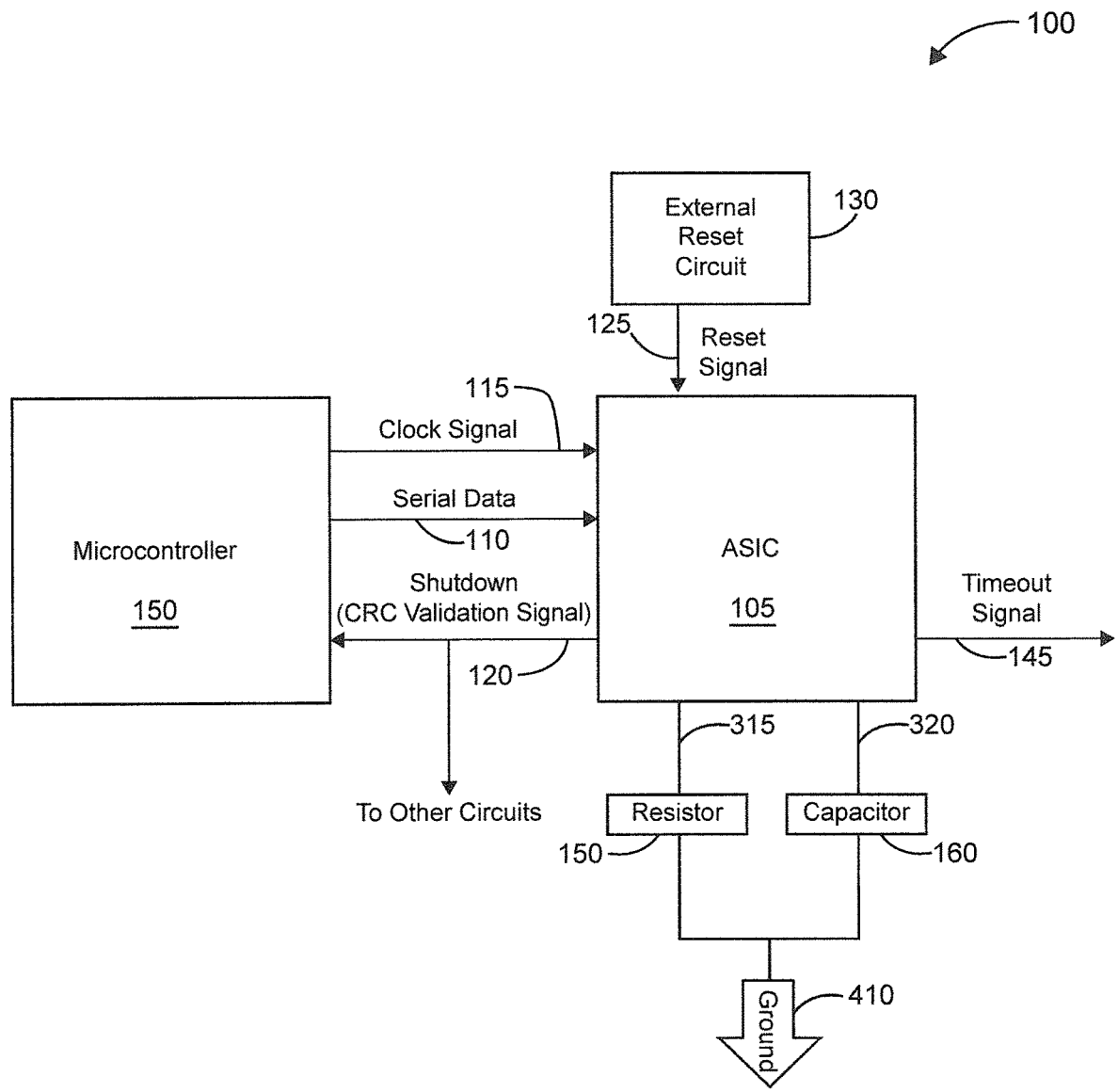
FIG. 1 is a block diagram of a memory check ASIC for a fuze or S&A device, according to some embodiments of the present disclosure.

It is to be understood that the foregoing general description and the following detailed description are exemplary and explanatory only and are not to be viewed as being restrictive of the embodiments, as claimed. Further advantages of these embodiments will be apparent after a review of the following detailed description of the disclosed embodiments, which are illustrated schematically in the accompanying drawings and in the appended claims.

DETAILED DESCRIPTION OF ILLUSTRATIVE EMBODIMENTS

In the following detailed description, numerous specific details are set forth in order to provide a thorough understanding of various aspects of one or more embodiments of the memory check application-specific integrated circuit (ASIC) for fuzes and safety and arm (S&A) devices. However, these embodiments may be practiced without some or all of these specific details. In other instances, well-known methods, procedures, and/or components have not been described in detail so as not to unnecessarily obscure the aspects of these embodiments.

Before the embodiments are disclosed and described, it is to be understood that these embodiments are not limited to the particular structures, process steps, or materials disclosed herein, but is extended to equivalents thereof as would be recognized by those ordinarily skilled in the relevant arts. It should also be understood that the terminology used herein is used for the purpose of describing particular embodiments only and is not intended to be limiting.

It should also be understood that some of the functional units described in this specification might have been labeled as "logics," in order to more particularly emphasize their implementation independence. For example, a logic may be implemented as a hardware circuit comprising custom VLSI circuits, ASIC circuits, or gate arrays, off-the-shelf semiconductors such as logic chips, transistors, or other discrete components. A logic may also be implemented in programmable hardware devices such as field programmable gate arrays (FPGA), programmable array logic, programmable logic devices or the like.

Reference throughout this specification to "one embodiment," "an embodiment," or "another embodiment" may refer to a particular feature, structure, or characteristic described in connection with the memory check ASIC for the fuzes and S&A devices. Thus, appearances of the phrases "in one embodiment" or "in an embodiment" in various places throughout this specification may not necessarily refer to the same embodiment.

Furthermore, the described features, structures, or characteristics may be combined in any suitable manner in various embodiments. In the following description, numerous specific details are provided, such as examples of materials, fasteners, sizes, lengths, widths, shapes, etc . . . , to provide a thorough understanding of the embodiments. One skilled in the relevant art will recognize, however, that the scope of protection can be practiced without one or more of the specific details, or with other methods, components, materials, etc. . . . . In other instances, well-known structures, materials, or operations are generally not shown or described in detail to avoid obscuring aspects of the disclosure.

Definitions

In the following description, certain terminology is used to describe certain features of the embodiments of the memory check ASIC. For example, as used herein, unless otherwise specified, the term "substantially" refers to the complete, or nearly complete, extent or degree of an action, characteristic, property, state, structure, item, or result. As an arbitrary example, an object that is "substantially" surrounded would mean that the object is either completely surrounded or nearly completely surrounded. The exact allowable degree of deviation from absolute completeness may in some cases depend on the specific context. However, generally speaking, the nearness of completion will be so as to have the same overall result as if absolute and total completion were obtained.

The use of "substantially" is equally applicable when used in a negative connotation to refer to the complete or near complete lack of an action, characteristic, property, state, structure, item, or result. As another arbitrary example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "approximately" generally refers to the actual value being within a range of 10% of the indicated value. The meaning of other terminology used herein should be easily understood by someone of reasonable skill in the art. For example, a resistor having a resistance between approximately 0.5 to 5 megaohms may refer to resistor having a resistance between 0.45 to 5.5 megaohms.

As used herein, the term "processor" generally refers to the logic circuitry that responds to and processes the basic instructions that drive a computer. The term "microcontroller" generally refers to a small computer on a single integrated circuit. A microcontroller generally contains one or more processors along with memory and programmable input/output peripherals. It may also be linked to and/or control other components, such as displays and/or actuators in the device. A "microcontroller" may include microprocessors, ASICs of any type and form, state machines, integrated circuits that perform similar and/or the same functions, and the like.

As used herein, the term "about" is used to provide flexibility to a numerical range endpoint by providing that a given value may be "a little above" or "a little below" the endpoint. In some cases, the term "about" is to include a range of not more than about two inches of deviation.

As used herein, the singular forms "a" and "the" may include plural referents, unless the context clearly dictates otherwise. Thus, for example, reference to a "transistor" can include reference to one or more of such transistors.

The embodiments of the memory check ASIC allow the use of "charge based memory" in clocked logic devices for safety critical applications. The embodiments help facilitate the reprogramming of firmware for flash-based microcontrollers and flash-based FPGAs in fuzes (e.g., S&A devices and ignition safety devices), which leads to faster development cycles, component cost reduction, and conservation of circuit board real estate.

Government safety standards generally govern the design and specifications of military explosive devices. These safety regulations usually require that the explosive devices be safe from inadvertent activity or operation in order to protect users from premature or accidental detonation. Some of the requirements pertaining to explosives and ordnances are detailed in military standard-1316E (MIL-STD-1316E) and the Joint Ordnance Test Procedure (JOTP).

MIL-STD-1316E and JOTP-051 require that fuze and S&A devices have a fixed-in-structure logic. Specifically, according to section 4.2.4 of MIL-STD-1316E (Electronic logic functions), "[a]ny electronic logic related to safety functions performed by the fuze shall be embedded as firmware or hardware. Firmware devices shall not be erasable or alterable by credible environments which the fuze would otherwise survive." Additionally, section 2.2 of the Technical Manual for the Use of Logic Devices in Safety Features (JOTP-051) states that "[w]hile fixed-in-structure devices are acceptable and preferred, to avoid degradation of a safety feature, any logic device used in the implementation of that feature . . . [s]hall not be re-programmable . . . ." This is likely due to possibility that the programmable logic may be susceptible to unpredictable operating states caused by certain environmental conditions as well as undesired design or manufacturing implementations. Thus, in order to comply with these government safety standards, current explosive devices utilize S&A mechanisms having hard wired logic or mask-programmed devices, rather than, programmable logic. The only programmable logic allowed in fuzes previously was "anti-fuse" technology due to its durability to unintentional change. As a result, a programmable logic device, including associated memory devices, may satisfy the requirements of paragraph 2.2 of the JOTP-051 if the internal logic of the programmed logic device cannot be changed.

In the event a device utilizes charge-based memory, these devices should implement a safety feature to validate the memory contents of the programmable firmware. In particular, Appendix A.2 of JOTP-051 states, "[f]or devices relying on charged-based memory to implement a Safety Feature (SF), a method of validating the integrity of the memory shall be performed prior to executing the safety function." In these instances, the memory must be validated with at least a 16 bit cyclic redundancy check (CRC) where the computed result is externally compared against a known value that is stored externally.

Accordingly, the embodiments of the memory check ASIC disclosed herein are configured to validate the memory contents of a microcontroller for fuzes and S&A devices via a CRC memory checker, in accordance with JOTP-051. Specifically, firmware may be reprogrammed into the system's memory, which may be charge-based memory. Upon initialization of the fuze or S&A device, the microcontroller preferably calculates a checksum on the program memory, wherein the calculated checksum is then transmitted to the ASIC for verification. If the calculated checksum matches the value stored in the ASIC (i.e. predetermined checksum), the contents within the flash-based memory are considered valid. Given that the calculated checksum is preferably a fixed 16-bit number, the last two words in the firmware code may be manipulated in order for the CRC to match the fixed 16-bit pattern stored in the ASIC.

In various embodiments, the memory check ASIC may also comprise an external reset circuit. The external reset circuit may maintain the circuits in reset by pulling the reset signal (nRST) logic low. In order to initiate the timeout and the digital logic, the external reset circuit may then pull reset signal logic high. Importantly, as the microcontroller initializes, the microcontroller may first calculate the checksum and send the 16-bit word checksum serially via the data line (SER_DATA) and clock line (SER_CLK). Depending on whether the calculated checksum matches the predetermined checksum value stored in the ASIC, the ASIC may transmit a shutdown signal to the microcontroller via the shutdown line (nSHUTDOWN). For example, if the calculated checksum is valid, the shutdown line may be logic high, indicating that the calculated checksum passed, and that the microcontroller can continue. On the other hand, if more than 16-bits are sent to the ASIC, the shutdown line may be a logic low, indicating an error.

In various embodiments, the memory check ASIC may also comprise an analog logic for performing a timeout function. The timeout function may create a timeout period for the CRC memory check, and the timeout period may be configured by an external capacitor and resistor. If the microcontroller does not transmit the calculated checksum within the timeout period for a predetermined time interval, then the CRC test may not pass. In some embodiments, the timeout feature may include transmitting a timeout signal via a timeout line for debugging.

Embodiments of the memory check ASIC are an improvement over existing devices because any modification to the firmware memory does not require changes to the printed circuit board. Rather, the firmware only requires the addition of a couple of words at the end of the program memory in order for CRC validation of the calculated checksum.

FIG. 1 is a block diagram of a memory check ASIC for a fuze or S&A device, according to some embodiments of the present disclosure. As shown in FIG. 1, one embodiment of the memory check ASIC 100 may be operatively coupled to a microcontroller 150 and may comprise: an ASIC 105, data line 110, clock line 115, shutdown line 120, and reset line 125. Various embodiments of the memory check ASIC 100 may also comprise an external reset circuit 130, timeout line 145, resistor terminal 315, capacitor terminal 320, resistor 150, capacitor 160, and ground potential 410.

As recited above, the microcontroller 150 is generally a small computer on a single integrated circuit and may contain one or more processors, memory, and input/output logics. Importantly, various embodiments of the microcontroller 150 may utilize flash-based memory, which is generally a non-volatile computer storage medium that can be electrically erased and reprogrammed. Thus, various embodiments of the fuze or S&A device may allow a user to reprogram the microcontroller 150 in multiple occasions for faster development cycles.

The ASIC 105 may be a integrated circuit chip that is custom designed for a specific application and is preferably operable to support CRC verification. The ASIC 105 may comprise a digital logic 310 (shown in FIG. 3) configured to verify the checksum data, which is preferably calculated and transmitted by the microcontroller 150. In an exemplary embodiment, the ASIC 105 may be in electrical communication with the microcontroller 150 via the clock line 115, data line 110, and shutdown line 120.

The clock line 115 may allow transmission of a clock signal 215 (SER_CLK) (shown in FIG. 2) from the microcontroller 150 to the ASIC 105. Upon coincidence of startup or reset, the clock signal 215 may comprise a predetermined number of clock cycles 218 (shown in FIG. 2) or pulses associated with serial data received by the ASIC 105 via the data line 110.

The data line 110 may allow transmission of a serial data signal 210 (SER_DATA) (shown in FIG. 2) from the microprocessor 150 to the ASIC 105 and may comprise serial data, including a calculated checksum 213. The calculated checksum 213 (shown in FIG. 2) is preferably generated by the microcontroller 150 based on contents of its flash-based memory.

The shutdown line 120 may allow transmission of a shutdown signal 220 (nSHUTDOWN) (shown in FIG. 2) from the ASIC 105 to the microcontroller 150, and the shutdown signal 220 may be transmitted in response to a CRC validation process performed by the digital logic 310 of the ASIC 105. Specifically, in the event the ASIC 105 determines that a checksum mismatch has occurred, the ASIC 105 may transmit a pulsed signal to the microcontroller 150 via the shutdown line 120. In this manner, the microcontroller 150 may halt or discontinue the startup process. In addition to the microcontroller 150 and ASIC 105, additional embodiments of the shutdown line 120 may also be in electrical communication with other circuitry of the fuze or S&A device, as shown in FIG. 1.

FIG. 1 also shows that an embodiment of the memory check ASIC 105 may also comprise an external reset circuit 130. The external reset circuit 130 may be configured to generate a reset signal 205 (nRST) (shown in FIG. 2), which may be transmitted to the ASIC 105 via the reset line 125. The reset signal 205 may be configured to initialize or reset the ASIC 105 into an initial or reset state. In this manner, the reset signal 205 may synchronize with the clock signal 215 and serial data signal 210 transmitted by the microcontroller 150. In a preferred embodiment, the reset line 125 may be electrically coupled to the reset terminal 335 (shown in FIG. 3) of the ASIC 105.

FIG. 1 also shows that embodiments of the memory check ASIC 100 may comprise: a resistor terminal 315 (tRES), capacitor terminal 320 (tCAP), resistor 150, capacitor 160, and timeout line 145. The resistor 150 and capacitor 160 may be used to configure or set the predetermined time interval 228 (shown in FIG. 2) of the timeout period for the CRC check. The first ends of the resistor 150 and capacitor 160 may electrically couple to the resistor terminal 315 and capacitor terminal 320 of the ASIC 105, respectively. The second ends of the resistor 150 and capacitor 160 may electrically couple to a ground potential 410.

Finally, FIG. 1 shows that the memory check ASIC 100 may comprise a timeout line 145. The timeout line 145 may allow transmission of a timeout signal 225 (TIMEOUT) (shown in FIG. 2) from the ASIC 105, in response to a determination that a threshold level associated with the clock signal 215 is reached before receiving the calculated checksum 213 from the microcontroller 150. For example, a timeout signal 225 can be generated by the ASIC 105 in response that a period of time has lapsed since the reset signal 205 was transmitted. In various embodiments, the timeout signal 225 may be transmitted to other circuitry of the fuze and S&A device to indicate an error.

Table 1 shown below depicts a basic summary of the various signals, voltage supply (VDD), and ground (GND) for various embodiments of the memory check ASIC 100.

TABLE 1

| Name | Function |
|---|---|
| Reset (nRST) | Pull down to reset, clear, or start over. Pull up to start logic and timer. Usually connected to a reset circuit. |
| Serial Clock (SER_CLK) | Serial clock coming from the microcontroller, only pulses when sending a bit. |
| Serial Data (SER_DATA) | Serial CRC bit stream coming from the microcontroller. The microcontroller sends CRC once after startup. |
| Shutdown (nSHUTDOWN) | Signal from the ASIC that tells the microcontroller that the CRC passed. High = passed Low = has not passed |
| Resistor Terminal (tRES) | Connect to resistor to ground for predetermined time interval (timeout period) |
| Capacitor Terminal (tCAP) | Connect to capacitor to ground for predetermined time interval (timeout period) |
| Timeout (TIMEOUT) | To indicate that timeout has completed High = timeout over Low = timeout is not over |
| Voltage Supply (VDD) | 3.3 V or 5.0 V power |
| Ground Potential (GND) | Ground |

In operation, the microcontroller 150 may calculate a checksum during startup based on the memory contents of the microcontroller 150. After the checksum is calculated, the microcontroller 150 may transmit the calculated checksum 213 and clock signal 215 serially to the ASIC 105 via the data line 110 and clock line 115, respectively. Upon retrieval, the digital logic 310 of the ASIC 105 may perform a CRC check on the calculated checksum 213 by comparing the calculated checksum 213 with a predetermined checksum 699 (shown in FIG. 5) stored in the ASIC 105. If the calculated checksum 213 matches the predetermined checksum 699 stored in the ASIC 105, the ASIC 105 may set the shutdown signal 220 to a logic high, indicating that the memory contents of the microcontroller 150 is valid. Otherwise, the shutdown signal 220 may continue to remain logic low. If more than than sixteen bits are transmitted, the shutdown signal 220 may remain logic low, indicating an error.

As recited above, the external reset circuit 130 may keep the ASIC 105 in reset by pulling the reset signal 205 to logic low and then pulling the reset signal 205 to logic high to begin the timeout function. In the event the microcontroller 150 does not transmit the checksum 213 within the predetermined time interval 228 of the timeout period, the CRC check may not pass. The duration of the timeout may be set by the resistor 150 and capacitor 160.

Figure 2:
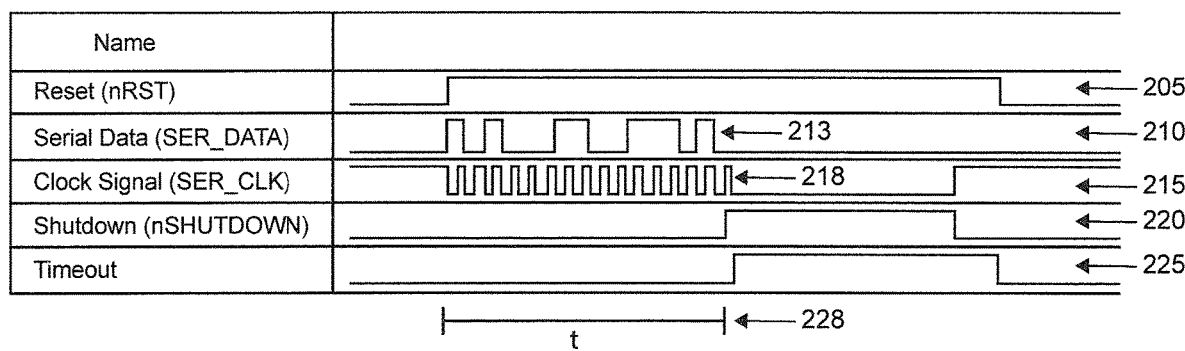
FIG. 2 is a timing diagram illustrating the operation of the memory check ASIC, according to some embodiments of the present disclosure, and depicts a representative relative timing of selective signals during operation.

FIG. 2 is a timing diagram illustrating the operation of the memory check ASIC, according to some embodiments of the present disclosure, and depicts a representative relative timing of selective signals during operation. Starting at the top, the timing of the reset signal 205 (nRST) is shown. As discussed above, the reset signal 205 may be a pulse (usually positive), which is generally used to initialize the ASIC 105 and bring the system to an initial or predetermined state. The reset signal 205 may be often applied after an initial power on and may also be used to synchronize with the clock signal 215 and serial data signal 210 transmitted via the data line 110.

FIG. 2 also depicts the timing of the serial data signal 210 (SER_DATA), which is shown directly beneath the reset signal 205. The serial data signal 210 may be a signal that is received and/or monitored by the ASIC 105 and preferably includes the calculated checksum 213 used for determining the validity of the memory contents of the microcontroller 150.

In one embodiment shown in FIG. 2, the calculated checksum 213 may be sixteen bits and may have a value of $1010001100111010_2$ or $A33A_{16}$. Importantly, FIG. 2 shows that the calculated checksum 213 may be transmitted while the reset signal 205 is logic high. It should be observed that each single bit of data in the serial data signal 210 may be associated with a cycle of the clock signal 215.

Shown below the serial data signal 210 in FIG. 2 is a clock signal 215, which may be a signal transmitted across the clock line 115. The clock signal 215 may be a reference signal employed for controlling timings of performing various operations of the memory check ASIC 100, including the serial data signal 210, shutdown signal 220, and timeout signal 225. In one embodiment, the clock signal 215 may be transmitted by the microcontroller 150 and may be sixteen clock cycles 218. Importantly, the rising edge of the clock signal 215 may be synchronized with the transmission of the reset signal 205 and/or serial data signal 210.

FIG. 2 also depicts the timing of the shutdown signal 220 (nSHUTDOWN), which is shown directly below the clock signal 215. As discussed above, the shutdown signal 220 may be a pulsed signal delivered once the calculated checksum 213 and/or clock cycles are received within a predetermined time interval 228 (t) or period of time. The shutdown signal 220 is also preferably transmitted by the ASIC 105 to the microcontroller 150 and perhaps to other circuitry. For example, as shown in FIG. 2, one embodiment of the ASIC 105 may transmit the shutdown signal 220 after transmission of sixteen clock cycles 218 and the calculated checksum 213.

FIG. 2 also depicts the timing of the timeout signal 225 (TIMEOUT), which is shown directly below the shutdown signal 220. The timeout signal 225 may be generated (e.g., by a timeout component of the ASIC 105) in response to a determination that a threshold level associated with the clock signal 215 is reached before receiving a data response associated with the calculated checksum 213 from the microcontroller 150. For example, a timeout signal 225 can be generated in response to a determination that a period of time has lapsed since the reset signal 205 was received by the ASIC 105 (e.g., without receiving the calculated checksum 213 from the microcontroller 150 during a predetermined time interval 228). The timeout signal 225 may also be transmitted to other circuitry of the fuze and S&A device to indicate an error.

Importantly, FIG. 2 shows the timing and operation of the above signals. As shown in FIG. 2, in one embodiment, the reset signal 205 may transition from logic low to logic high in order to initiate or restore the ASIC 105 to operation. The serial data 210 may also be clocked on the rising edge of the clock signal 215. While the reset signal 205 is at a logic high, the ASIC 105 may increment its count in conjunction with the clock signal 215. During this time, the ASIC 105 may monitor the data line 110 for serial data associated with the calculated checksum 213 in order to determine the validity of the memory contents of the microcontroller 150. The calculated checksum 213, for example, may be sixteen bits and may have a value of $1010001100111010_2$ or $A33A_{16}$ in sixteen clock cycles, as shown in FIG. 2. The calculated checksum 213 may also be transmitted while the reset signal 205 is high. Once received, the digital logic 310 of the ASIC 105 may compare the calculated checksum 213 with the stored value in the ASIC 105 (i.e., predetermined checksum 699) to determine whether a checksum mismatch occurs. In the event that the microprocessor 150 does not transmit the calculated checksum 213 within the predetermined time interval 228, a pulse from the shutdown signal 220 may be asserted by transitioning from low to high. The ASIC 105 may also transmit a pulsed timeout signal 225 to indicate that a timeout occurred. A reset signal 205 may then be used to reset all logic in order to reinitiate the process again.

Figure 3:
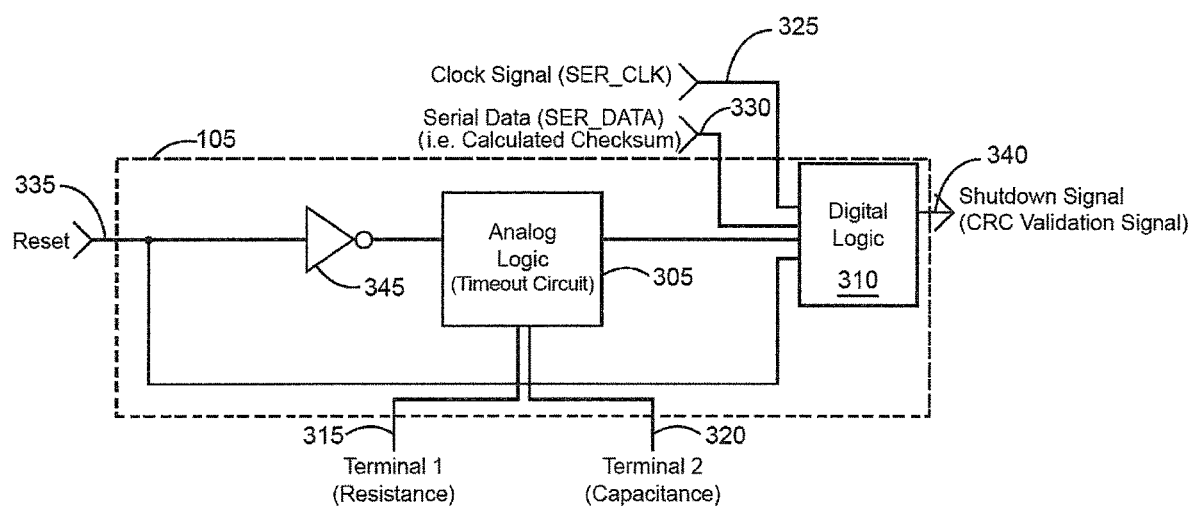
FIG. 3 is a block diagram of an ASIC for the fuze and S&A device, according to some embodiments of the present disclosure.

FIG. 3 is a block diagram of an ASIC for the fuze and S&A device, according to some embodiments of the present disclosure. As shown in FIG. 3, one embodiment of the ASIC 105 may comprise an analog logic 305, digital logic 310, resistor terminal 315, capacitor terminal 320, clock terminal 325, serial data terminal 330, reset terminal 335, and shutdown terminal 340. The digital logic 310 may be configured to perform a CRC check on the calculated checksum 213 received through the data line 110. The calculated checksum 213 may also be synchronized with the clock signal 215 transmitted through clock line 115. The analog logic 305 may be configured to employ a timeout function used in the event when the microcontroller 150 does not send the calculated checksum 213 within a predetermined time interval 228. As a result, the CRC test may not pass, and a timeout signal 225 may be transmitted via the timeout line 145.

FIG. 3 also shows that the ASIC 105 may comprise a resistor terminal 315, capacitor terminal 320, serial clock terminal 325, serial data terminal 330, reset terminal 335, and shutdown terminal 340. As recited above, the resistor terminal 315 and capacitor terminal 320 may be electrically coupled to a resistor 150 and a capacitor 160, respectively, in order to configure the timeout period or predetermined time interval 228. Serial clock terminal 325 and serial data terminal 330 may be configured to receive the clock signal 215 and serial data signal 210, respectively. Reset terminal 335 may be configured to receive the reset signal 205, whereas the shutdown signal 225 may be transmitted through shutdown terminal 340.

As shown in FIG. 3, the reset signal 205 may be transmitted to reset terminal through an inverter 345 for operation. Here, the reset signal 205 may initialize the timeout function in the analog logic 305 and the CRC check process within the digital logic 310. At this moment, the serial data signal 210 may enter through serial data terminal 330 of the ASIC 105 and may be clocked on a rising or lowering edge of the clock signal 215. During reset, which may be a logic high of the reset signal 205, the ASIC 105 may monitor the data line 110 for serial data associated with the calculated checksum 213 while incrementing its count with the clock signal 215 entering through serial clock terminal 325. In this manner, depending whether a checksum mismatch occurs, the ASIC 105 may validate the memory contents of the microcontroller 150 and may transmit a shutdown signal 220 through shutdown terminal 340. In the event that the microprocessor 150 does not transmit the calculated checksum 213 within the predetermined time interval 228, a pulse from the shutdown signal 220 may be asserted. In various embodiments, the ASIC 105 may also transmit a timeout signal 225, indicating that a timeout occurred. The reset signal 205 entering reset terminal 335 may then be used to reset all logic and the timeout circuit in order to reinitiate the process again.

Figure 4:
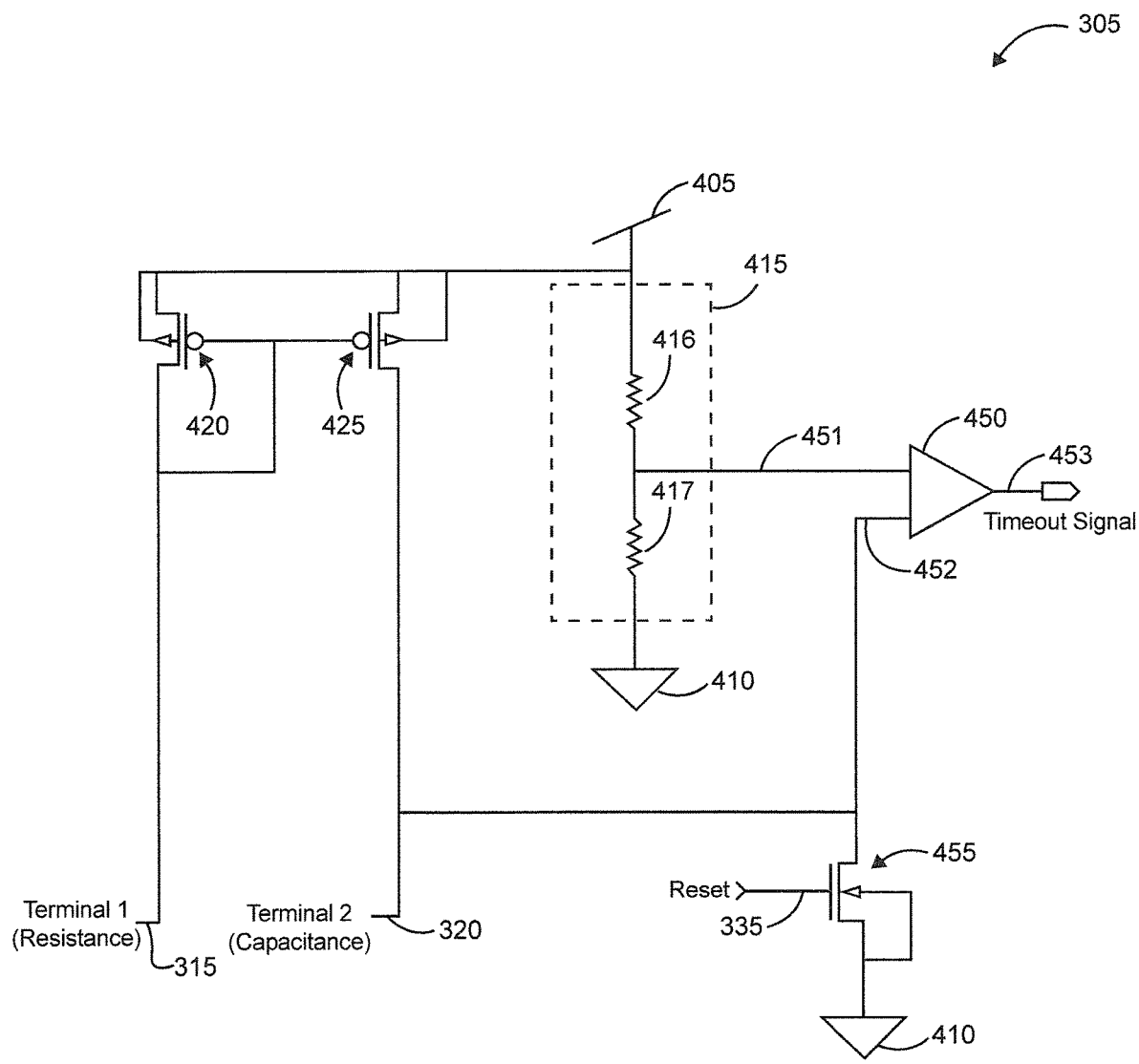
FIG. 4 is a schematic of an analog logic for the ASIC, according to some embodiments of the present disclosure.

FIG. 4 is a schematic of an analog logic for the ASIC, according to some embodiments of the present disclosure. As shown in FIG. 4, one embodiment of the analog logic 305 may comprise: a voltage supply 405, ground potential 410, voltage divider 415, transistors 420, 425, 455, resistor terminal 315, capacitor terminal 320, and comparator 450. The comparator 450 may be a component that compares two voltages taken from its first input terminal 451 and second input terminal 452 and generally outputs a signal indicating the larger voltage. In one embodiment, the first input terminal 451 of the comparator 450 may take an output voltage from the voltage divider 415, whereas the second input terminal 452 of the comparator 450 may be taken from the drain of transistor 425.

The voltage divider 415 is generally a passive linear circuit that produces a portion of the voltage supply 405 and may comprise resistors 416, 417, both of which may be coupled in series. Thus, depending on the values of the resistors 416, 417, the output of the voltage divider 415 may be used as a reference input voltage for the comparator 450. In one embodiment, the resistors 416, 417 may be 10 k ohms and 20 k ohms, respectively, such that an output reference voltage from the voltage divider 415 having a supply voltage of 5V is 3.33 V.

FIG. 4 also shows that the analog logic 305 may comprise transistors 420, 425. In one embodiment, the transistors 420, 425 may be p-channel MOSFETs, the sources of which may be electrically coupled to the voltage supply 405. The gate and drain of transistor 420 and the gate of transistor 425 may be electrically coupled to resistor terminal 315 and preferably to a first end of the resistor 150. The drain of transistor 425, on the other hand, may be electrically coupled to capacitor terminal 320 and one electrode of the capacitor 160. The second end of resistor 150 and other electrode of the capacitor 160 may be electrically coupled to ground potential 410. The resistor 150 preferably limits the current flowing through the transistors 425, 420, and the capacitor 160 preferably limits the amount of voltage transferring from the drain of transistor 425.

As recited above, the output voltage taken from the drain of transistor 425 may be used as the second input 452 of the comparator 450. In this manner, the voltage taken from the drain of resistor 150 may be compared to the output voltage of the voltage divider 415. Importantly, resistor 150 and capacitor 160 may be used to configure the timeout period in milliseconds. The amount of resistance and capacitance values are discussed in more detail below in FIG. 8.

FIG. 4 also shows that the analog logic 305 may comprise a transistor 455, which may be an n-channel MOSFET. Transistor 455 preferably controls the amount of voltage applied to the second input 452 of the comparator 450. In order to activate transistor 455, a sufficient positive voltage may be applied to the drain and gate of the transistor 455. This in turn may discharge the accumulated voltage stored in the capacitor 160. Thus, a reset signal applied to the gate of the transistor 455 may control the current flow through the drain-source channel and may discharge the accumulated voltage stored in the capacitor 160, causing capacitor 160 to reset the time. The time required to charge the capacitor 160 may correspond to the duration of the timeout period (i.e., predetermined time interval 228).

Figure 5:
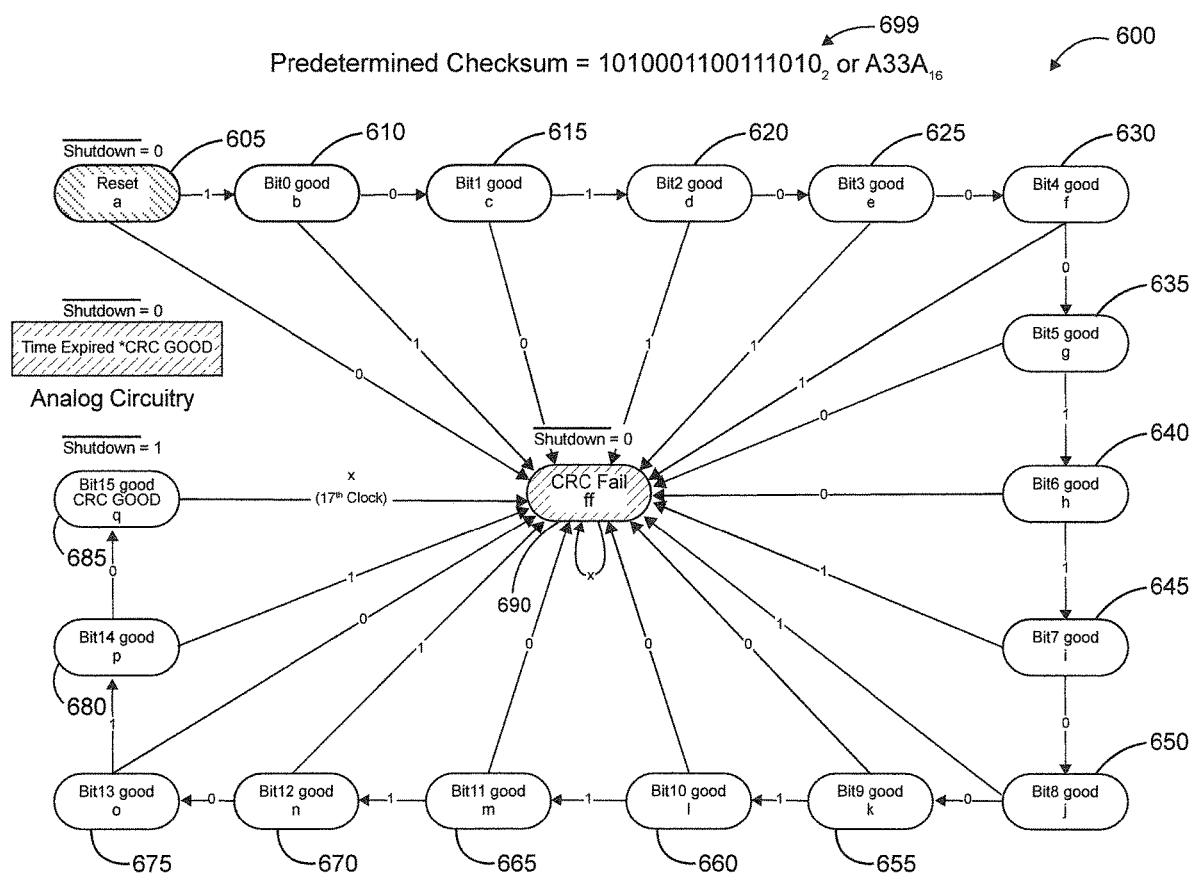
FIG. 5 is a state machine diagram illustrating the operation of the digital logic of the ASIC, according to some embodiments of the present disclosure.
Figure 6A:
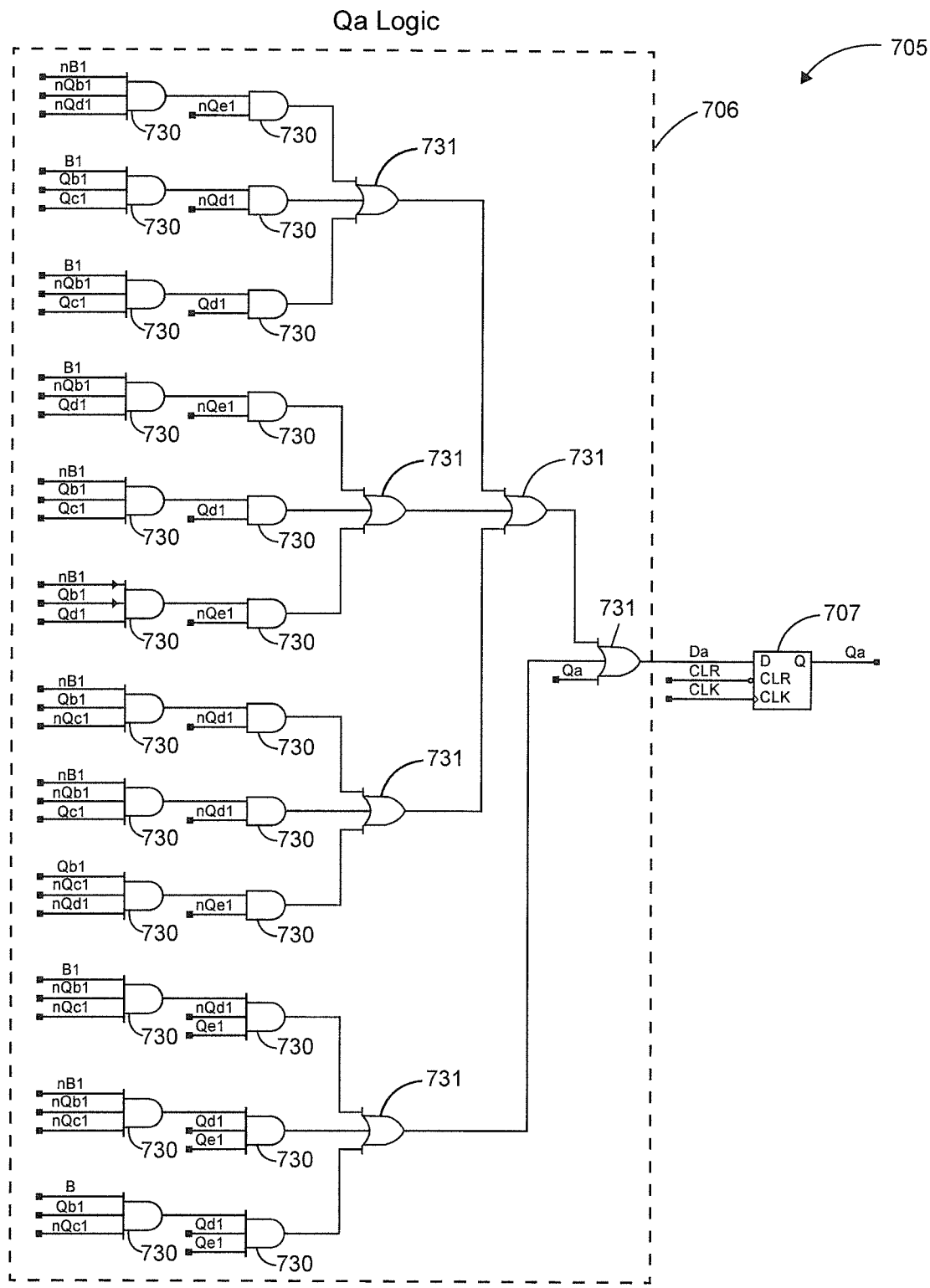
FIGS. 6A to 6E are schematics of the digital logic of the ASIC, according to some embodiments of the present disclosure.
Figure 6B:
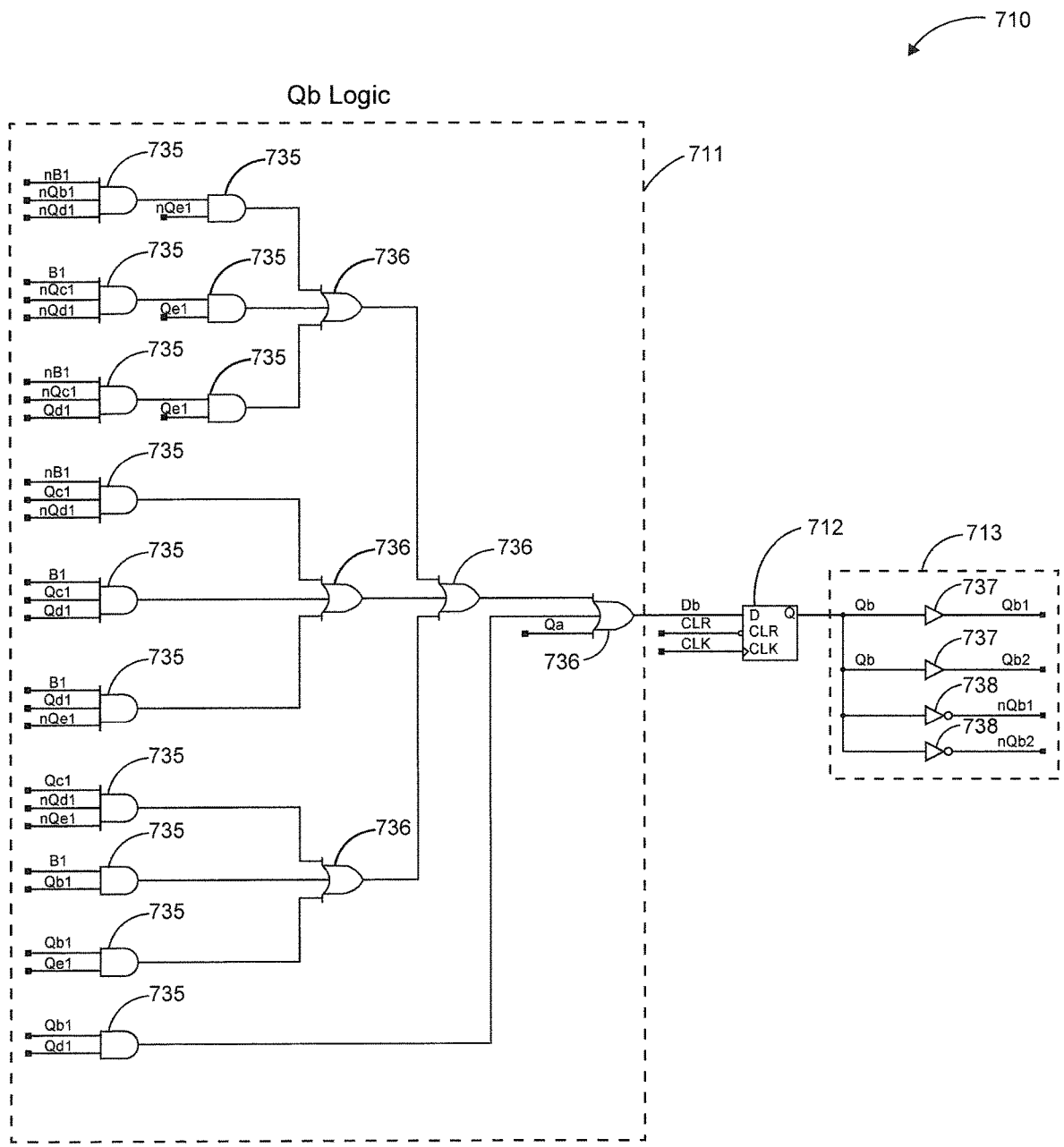
Figure 6C:
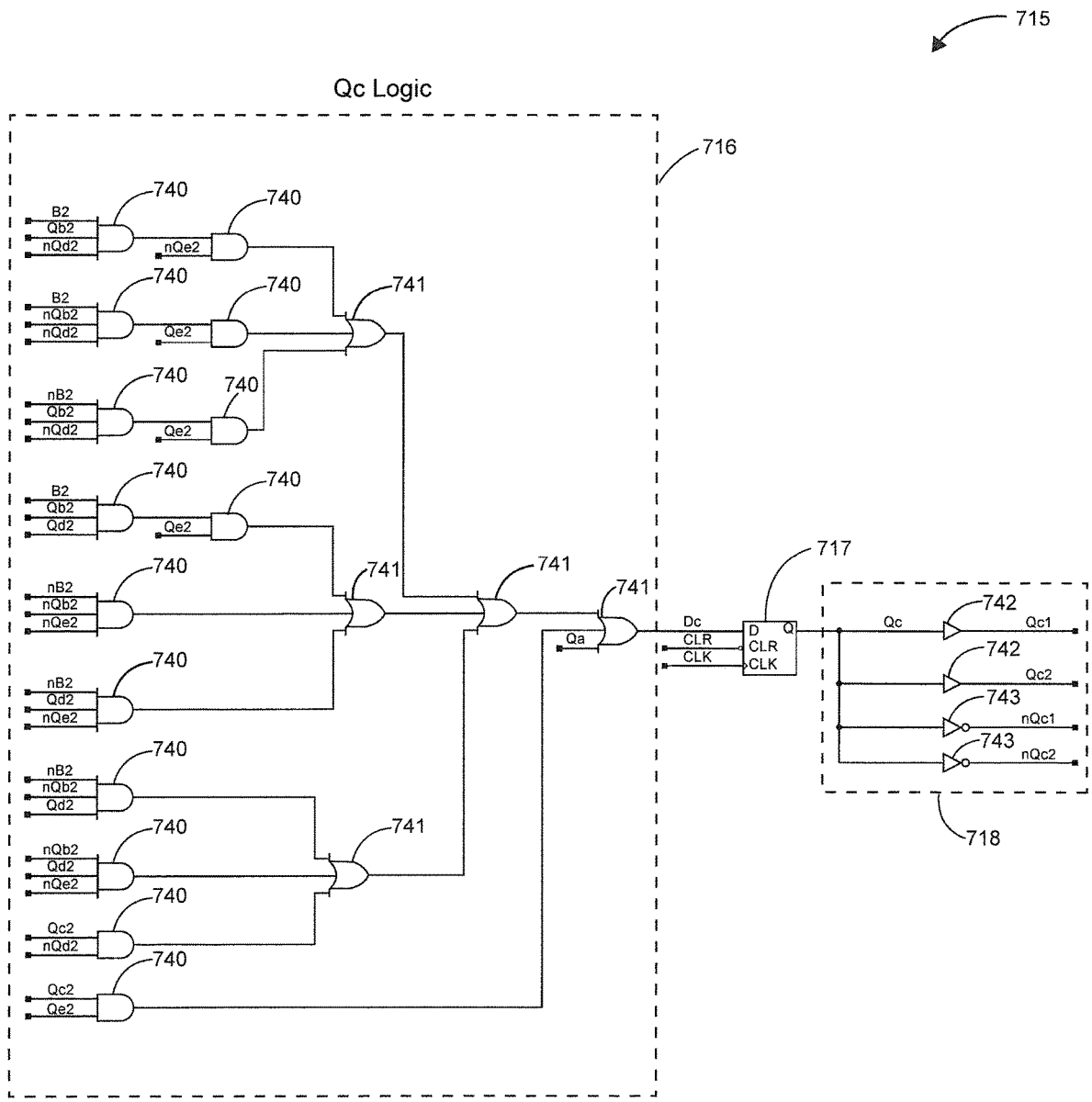
Figure 6D:
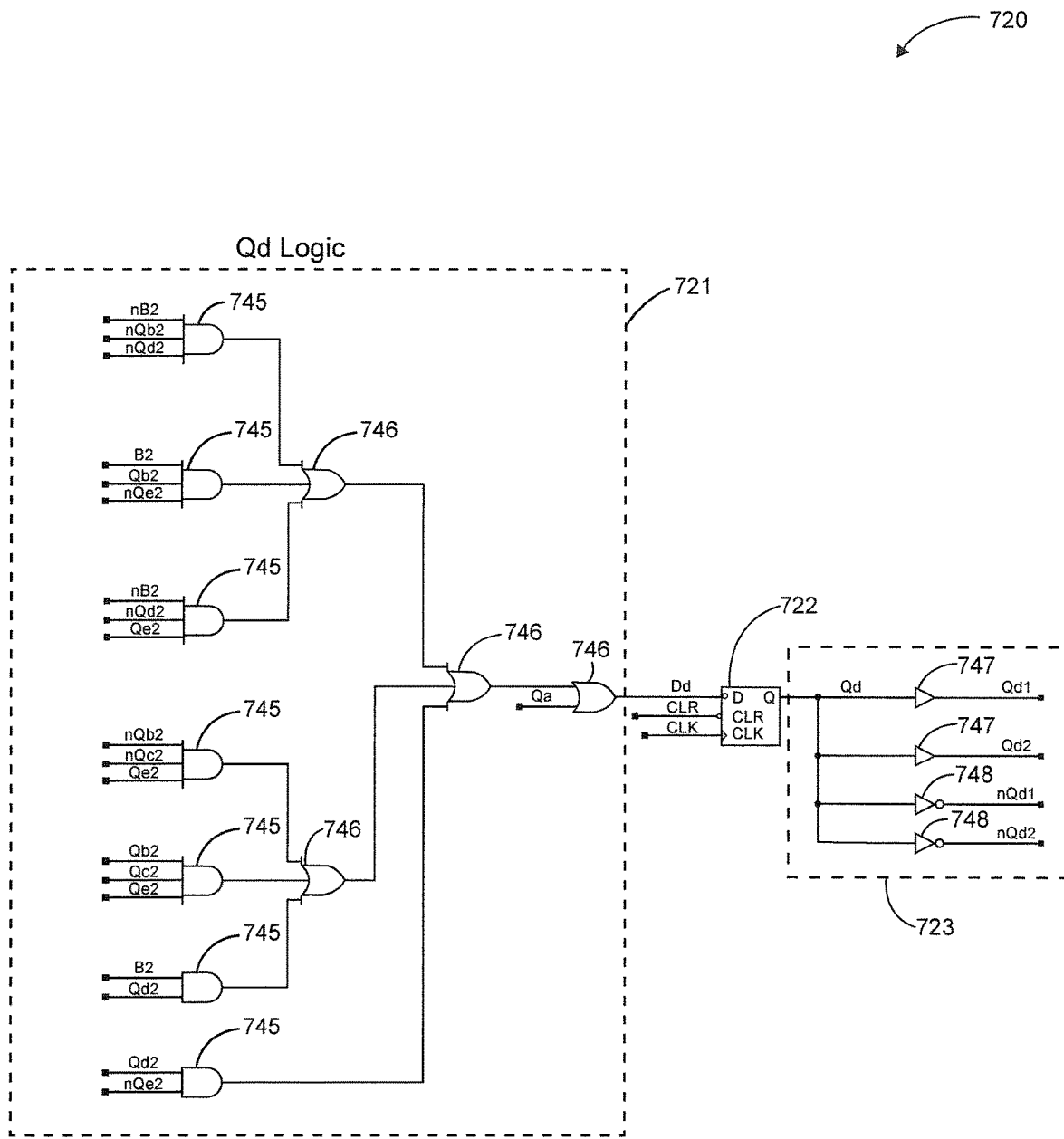
Figure 6E:
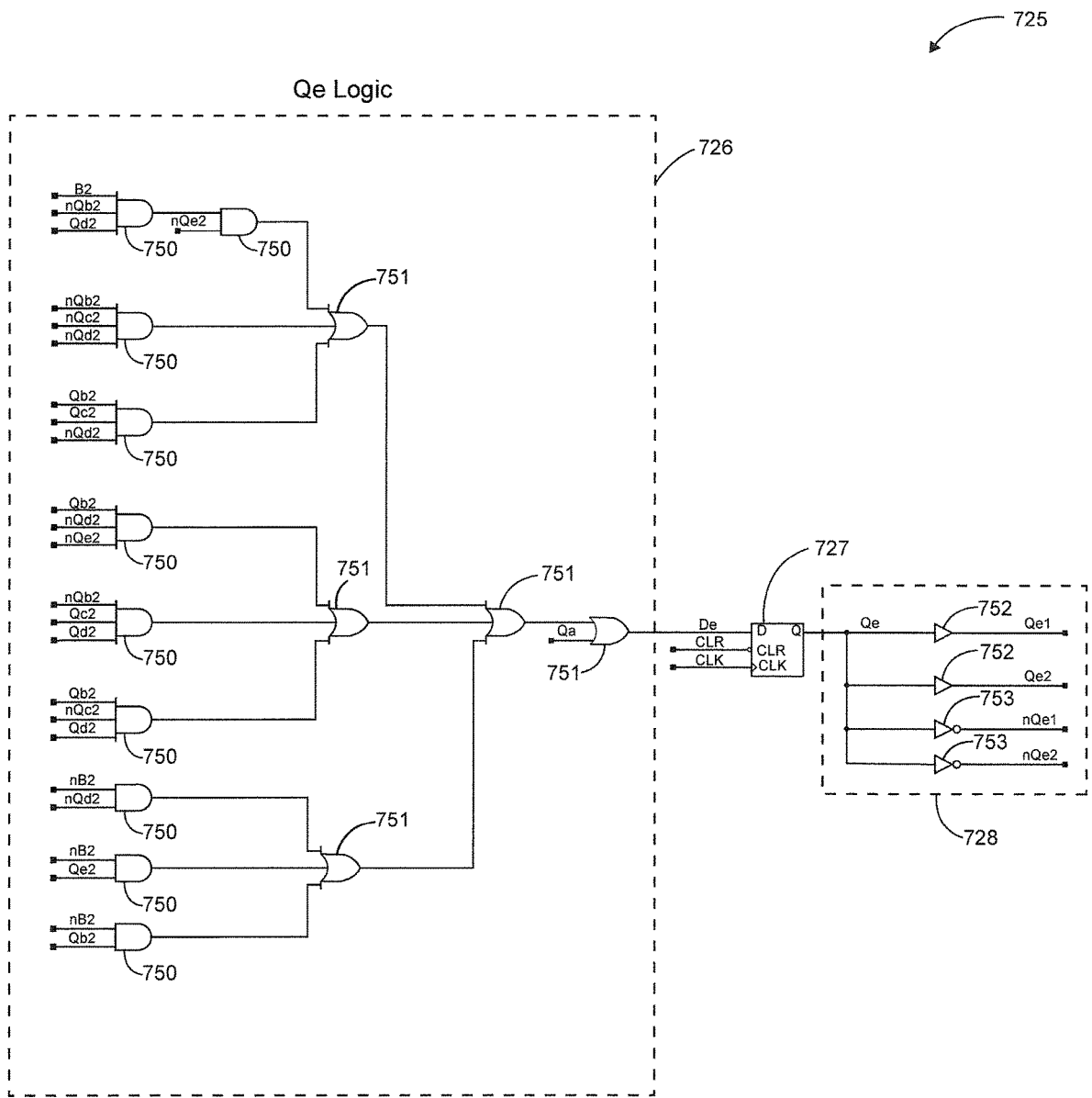

FIG. 5 is a state machine diagram illustrating the operation of the digital logic of the ASIC, according to some embodiments of the present disclosure. As shown in FIG. 5, one embodiment of the state machine (SM) 600 may comprise steps 605, 610, 615, 620, 625, 630, 635, 640, 645, 650, 655, 660, 665, 670, 675, 680, 685 and may have a stored checksum value (i.e., predetermined checksum 699) of $1010001100111010_2$ or $A33A_{16}$.

FIG. 5 shows step 605, which may be a reset state, where the ASIC 105 may monitor the data line 110 for serial data 210 when the shutdown signal 220 is zero or logic low. If the reset signal 205 is asserted by an external reset circuit 130, this may force the ASIC 105 to enter into the reset state in step 605. At this time, the ASIC 105 may receive serial data, including the calculated checksum 213. The ASIC 105 may then detect the first bit (bit 0) of the calculated checksum 213 during the first clock cycle to determine whether bit 0 has been set to 1. If bit 0 is set to 1, the SM 600 may continue to step 610, in which the serial data shifts via shift registers (e.g., D flip flops). Otherwise, if bit 0 is set to 0, the SM 600 continues directly from step 605 to step 690, and the digital logic 310 determines that the CRC check failed due to a CRC checksum mismatch. The shutdown signal 220 then continues to remain zero or low.

At the second clock cycle in step 610, the ASIC 105 may detect the second bit (bit 1) of the calculated checksum 213 to determine whether bit 1 has been set to 0. If bit 1 is set to 0, the SM 600 may continue to step 615, in which the serial data shifts. Otherwise, if bit 1 is set to 1, the SM 600 continues directly from step 610 to step 690, and the digital logic 310 determines that the CRC check failed due to a CRC checksum mismatch. The shutdown signal 220 then continues to remain zero or low.

At the third clock cycle in step 615, the ASIC 105 may detect the third bit (bit 2) of the calculated checksum 213 within the serial data signal 210 to determine whether bit 2 has been set to 1. If bit 2 is set to 1, the SM 600 may continue to step 620, and the serial data may shift. Otherwise, if bit 2 is set to 0, the SM 600 continues directly from step 615 to step 690, and the digital logic 310 determines that the CRC check failed due to a CRC checksum mismatch. The shutdown signal 220 then continues to remain zero or low.

At the fourth clock cycle in step 620, the ASIC 105 may detect the fourth bit (bit 3) of the calculated checksum 213. Here, the digital logic 310 preferably determines whether bit 3 has been set to 0. If bit 3 is set to 0, the SM 600 continues into step 625, and the serial data shifts. Otherwise, if bit 3 is set to 1, the SM 600 continues directly from step 620 to step 690, and the digital logic 310 determines that the CRC check failed due to a CRC checksum mismatch. The shutdown signal 220 then continues to remain zero or low.

At the fifth clock cycle in step 625, the ASIC 105 may detect the fifth bit (bit 4) of the calculated checksum 213 to determine whether bit 4 has been set to 0. If bit 4 is set to 0, the SM 600 may continue to step 630, and the serial data shifts. Otherwise, if bit 3 is set to 1, the SM 600 continues directly from step 625 to step 690, and the digital logic 310 may determine that the CRC check failed due to a CRC checksum mismatch. The shutdown signal 220 then continues to remain zero or low.

At the sixth clock cycle in step 630, the ASIC 105 may detect the sixth bit (bit 5) of the calculated checksum 213 to determine whether bit 5 has been set to 0. If bit 5 is set to 0, the SM 600 may continue to step 635, and the serial data shifts. Otherwise, if bit 5 is set to 1, the SM 600 continues directly from step 630 to step 690, and the digital logic 310 determines that the CRC check failed due to a CRC checksum mismatch. The shutdown signal 220 then continues to remain zero or low.

At the seventh clock cycle in step 635, the ASIC 105 may detect the seventh bit (bit 6) of the calculated checksum 213 to determine whether bit 6 has been set to 1. If bit 6 is set to 1, the SM 600 may continue to step 640, and the serial data shifts. Otherwise, if bit 6 is set to 0, the SM 600 continues directly from step 635 to step 690, and the digital logic 310 determines that the CRC check failed due to a CRC checksum mismatch. The shutdown signal 220 then continues to remain zero or low.

At the eighth clock cycle in step 640, the ASIC 105 may detect the eighth bit (bit 7) of the calculated checksum 213 to determine whether bit 7 has been set to 1. If bit 7 is set to 1, the SM 600 may continue to step 645, and the serial data shifts. Otherwise, if bit 7 is set to 0, the SM 600 continues directly from step 640 to step 690, and the digital logic 310 determines that the CRC check failed due to a CRC checksum mismatch. The shutdown signal 220 then continues to remain zero or low.

At ninth clock cycle in step 645, the ASIC 105 may detect the ninth bit (bit 8) of the calculated checksum 213 within the serial data signal 210 to determine whether bit 8 has been set to 0. If bit 8 is set to 0, the SM 600 may continue to step 650, and the serial data shifts. Otherwise, if bit 8 is set to 1, the SM 600 continues directly from step 645 to step 690, and the digital logic 310 determines that the CRC check failed due to a CRC checksum mismatch. The shutdown signal 220 then continues to remain zero or low.

At the tenth clock cycle, the SM may be in step 650. Here, the ASIC 105 may detect the tenth bit (bit 9) of the calculated checksum 213 within the serial data signal 210 to determine whether bit 9 has been set to 0. If bit 9 is set to 0, the SM 600 may continue to step 655, and the serial data shifts. Otherwise, if bit 9 is set to 1, the SM 600 continues directly from step 650 to step 690, and the digital logic 310 determines that the CRC check failed due to a CRC checksum mismatch. The shutdown signal 220 then continues to remain zero or low.

At the eleventh clock cycle in step 655, the ASIC 105 may detect the eleventh bit (bit 10) of the calculated checksum 213 to determine whether bit 10 has been set to 1. If bit 10 is set to 1, the SM 600 may continue to step 660, and the serial data shifts. Otherwise, if bit 10 is set to 0, the SM 600 continues directly from step 655 to step 690, and the digital logic 310 determines that the CRC check failed due to a CRC checksum mismatch. The shutdown signal 220 then continues to remain zero or low.

At the twelfth clock cycle in step 660, the ASIC 105 may detect the twelfth bit (bit 11) of the calculated checksum 213 to determine whether bit 11 has been set to 1. If bit 11 is set to 1, the SM 600 may continue to step 665, and the serial data shifts. Otherwise, if bit 10 is set to 0, the SM 600 continues directly from step 660 to step 690, and the digital logic 310 determines that the CRC check failed due to a CRC checksum mismatch. The shutdown signal 220 then continues to remain zero or low.

At the thirteenth clock cycle in step 665, the ASIC 105 may detect the thirteenth bit (bit 12) of the calculated checksum 213. In this manner, the ASIC may determine whether the bit 12 has been set to 1. If bit 12 is set to 1, the SM 600 may continue to step 670, and the serial data shifts. Otherwise, if bit 12 is set to 0, the SM 600 continues directly from step 665 to step 690, and the digital logic 310 determines that the CRC check failed due to a CRC checksum mismatch. The shutdown signal 220 then continues to remain zero or low.

At the fourteenth clock cycle, the SM is preferably in step 670. Here, the ASIC 105 may detect the fourteenth bit (bit 13) of the calculated checksum 213 to determine whether the bit 13 has been set to 0. If bit 13 is set to 0, the SM 600 may continue to step 675, and the serial data shifts. Otherwise, if bit 13 is set to 1, the SM 600 continues directly from step 670 to step 690, and the digital logic 310 determines that the CRC check failed due to a CRC checksum mismatch. The shutdown signal 220 then continues to remain zero or low.

At the fifteenth clock cycle in step 675, the ASIC 105 preferably detects the fifteenth bit (bit 14) of the calculated checksum 213. This will allow the ASIC to determine whether bit 14 has been set to 1. If bit 14 is set to 1, the SM 600 may continue to step 680, and the serial data shifts. Otherwise, if bit 14 is set to 0, the SM 600 continues directly from step 675 to step 690, and the digital logic 310 determines that the CRC check failed due to a CRC checksum mismatch. The shutdown signal 220 then continues to remain zero or low.

At the sixteenth clock cycle in step 680, the ASIC 105 may detect the sixteenth bit (bit 15) of the calculated checksum 213. In this manner, the ASIC 105 may determine whether bit 15 has been set to 0. If bit 15 is set to 0, the SM 600 may continue to step 685, and the serial data shifts. Otherwise, if bit 15 is set to 1, the SM 600 continues directly from step 680 to step 690, and the digital logic 310 determines that the CRC check failed due to a CRC checksum mismatch. The shutdown signal 220 then continues to remain zero or low.

At the seventeenth clock cycle, the SM may be in step 685. Here, the ASIC 105 has completed verification of the calculated checksum 213, and as a result, the shutdown signal 220 may be set to 1 or logic high. In the event the ASIC 105 receives additional bits or the calculated checksum 213 does not arrive within the predetermined time period, the SM 600 continues into step 690, and the digital logic 310 determines that the CRC check failed. The shutdown signal 220 may then continue to remain zero or low.

FIGS. 6A to 6E are schematics of the digital logic of the ASIC, according to some embodiments of the present disclosure. FIGS. 6A to 6E also preferably implement and enable the state machine 600, depicted in FIG. 5. As shown in FIGS. 6A to 6E, one embodiment of the digital logic 310 may comprise circuit portions 705, 710, 715, 720, 725, each of which may comprise: a combinational circuit 706, 711, 716, 721, 726, flip-flop 707, 712, 717, 722, 727, and output circuit 713, 718, 723, 728. In particular, circuit portion 705 of the digital logic 310 may comprise a combinational circuit 706 and a flip-flop 707; circuit portion 710 of the digital logic 310 may comprise a combinational circuit 711, flip-flop 712, and output circuit 713; circuit portion 715 of the digital logic 310 may comprise a combinational circuit 716, flip-flop 717, and output circuit 718; circuit portion 720 of the digital logic 310 may comprise a combinational circuit 721, flip-flop 722, and output circuit 723; and circuit portion 725 of the digital logic 310 may comprise a combinational circuit 726, flip-flop 727, and output circuit 728.

Each combinational circuit 706, 711, 716, 721, 726 generally outputs the current state variables of the SM 600 and may comprise a combination of AND gates 730, 735, 740, 745, 750 and OR gates 731, 736, 741, 746, 751, all of which preferably precede the inputs of the flip-flops 707, 712, 717, 722, 727. Importantly, each combinational circuit 706, 711, 716, 721, 726 generally includes inputs and outputs of the digital logic 310 and generally provides the logic for the next state of the SM 600. In other words, given that the inputs of the flip-flops 707, 712, 717, 722, 727 indicate the next states after a clock pulse, the combinational circuits 706, 711, 716, 721, 726 provide the logical operations for the next state of the SM 600.

The flip-flops 707, 712, 717, 722, 727 are generally switching circuits that change from one stable state to another, in response to a triggering pulse (e.g., clock pulse of the clock signal 215). In multiple embodiments, the flip-flops 707, 712, 717, 722, 727 may be D flip-flops due to their transparent latch features in passing the D input variable to the Q output variable when clocked. Given that the SM 600 in FIG. 5 comprises at least eighteen states or steps, at least five state variables or bits are needed to accommodate the sixteen states of the SM 600:

$$18_{10} = 10010_2$$

Therefore, as shown in FIGS. 6A to 6E, the digital logic 310 may comprise five flip-flops 707, 712, 717, 722, 727, each of which may represent a state variable ("a," "b," "c," "d," "e") of the SM 600. The flip-flops 707, 712, 717, 722, 727 are generally used to track and synchronize each state of the SM 600, and each output of the flip-flops 707, 712, 717, 722, 727 generally enables a state variable for each state of the SM 600. For example, the reset state, shown in step 605 may be represented with state variables being "00000," wherein each of the flip-flops 707, 712, 717, 722, 727 may store a state variable of "0".

Finally, the output circuits 713, 718, 723, 728 following the flip-flops 707, 712, 717, 722, 727 generally output the present state of the SM 600. Each of the output circuits 713, 718, 723, 728 may comprise buffers 737, 742, 747, 752 and inverters 738, 743, 748, 753 and generally provide outputs that are fed back to the combinational circuits 706, 711, 716, 721, 726.

In operation, the combinational circuits 706, 711, 716, 721, 726 may be used to determine the next state of the SM 600. This would generally depend on the serial data transmitted on the data line 110. Upon determining the next state of the SM 600, the outputs of the combinational circuits 706, 711, 716, 721, 726 are preferably fed into the flip-flops 707, 712, 717, 722, 727. In this manner, upon coincidence of a rising-edge clock signal 215, the outputs of the combinational circuits 706, 711, 716, 721, 726 may pass from the input variable to the output variable of the flip-flops 707, 712, 717, 722, 727, such that the outputs of the combinational circuits 706, 711, 716, 721, 726 may become the present state of the SM 600. The outputs of the flip-flops 707, 712, 717, 722, 727 may then enter the output circuits 713, 718, 723, 728 to create two logic outputs (high and low). These logic high and low outputs may then be inputted into the combinational circuits 706, 711, 716, 721, 726 for further processing of the next state. The reset signal 205 transmitted on the reset line 125 may be latched by the flip-flops 707, 712, 717, 722, 727 to clear the stored value in the flip-flops 707, 712, 717, 722, 727, thereby initializing the SM 600 to state "00000" shown in step 605 of FIG. 5.

Figure 7:
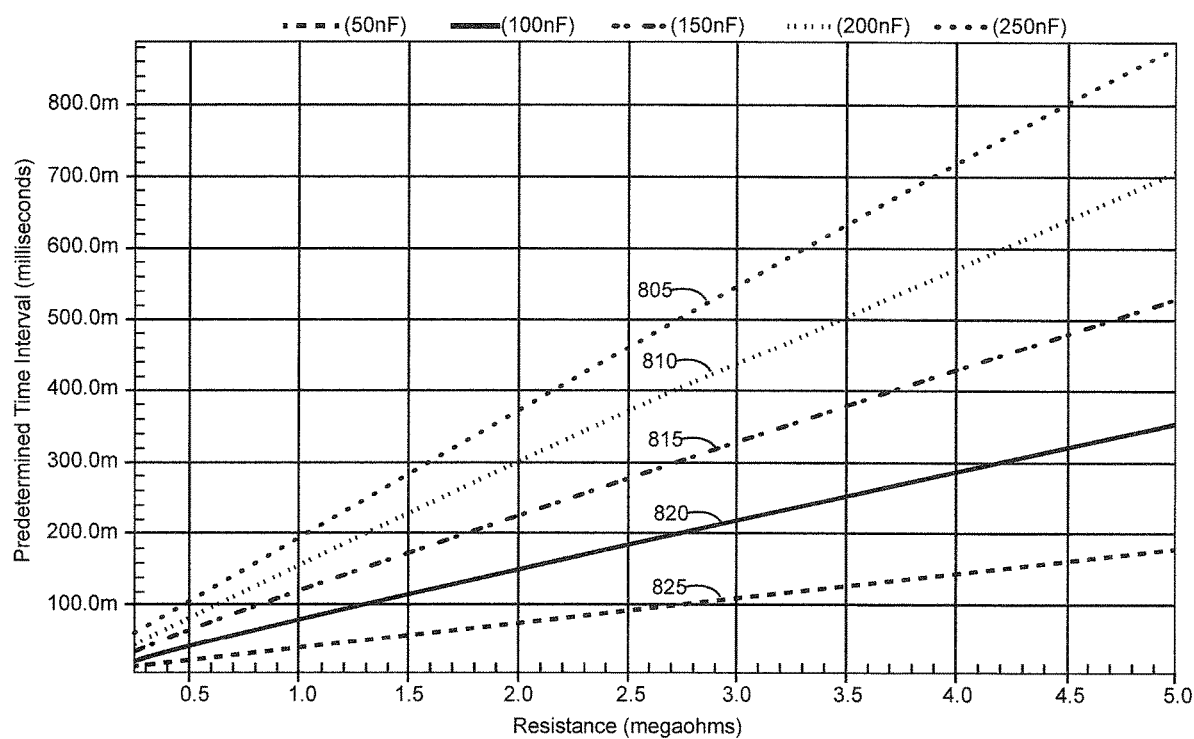
FIG. 7 is a graph used for selecting an appropriate resistor and capacitor for configuring the predetermined time interval of the timeout period, according to some embodiments of the present disclosure.

FIG. 7 is a graph used for selecting an appropriate resistor and capacitor for configuring the duration or predetermined time interval 228 of the timeout period, according to some embodiments of the present disclosure. As shown in FIG. 8, the graph depicts the relationships between time, resistance, and capacitance and shows the unit of values in milliseconds, megaohms, and nanofarads, respectively. Specifically, the graph in FIG. 8 depicts the predetermined time interval 228 plotted on the left vertical axis versus resistance on the horizontal axis. Each of the five graph lines also may represent a particular capacitance. In particular, graph line 805 may represent a capacitor having a capacitance with 250 nanofarads; graph line 810 may represent a capacitor having a capacitance of 200 nanofarads; graph line 815 may represent a capacitor having a capacitance of 150 nanofarads; graph line 820 may represent a capacitor having a capacitance of 100 nanofarads; and graph line 825 may represent a capacitor having a capacitance with 50 nanofarads. Thus, in order to configure the duration or predetermined time interval 228 for the timeout period, the values of the resistor and capacitor associated with the analog logic may be determined with the FIG. 8 graph.

Notably, FIG. 8 shows that as the resistance and capacitance increases, the duration of the timeout period also increases linearly. For example, in order to have at predetermined time interval 228 of 100.0 milliseconds, a 500 k ohms resistor and a 250 nanofarads capacitor may be used for the resistor terminal 315 and capacitor terminal 320 of the ASIC 105. Similarly, in order to have a predetermined time interval 228 of 500 milliseconds, a 3.5 megaohm resistor and a 200 nanofarads capacitor may also be used. In one embodiment of the memory check ASIC 100, a predetermined time interval 228 of 200 milliseconds may be achieved by having a 250 nanofarads capacitor and a 1 megaohm resistor installed on the resistor terminal 315 and capacitor terminal 320 of the ASIC 105.

The foregoing descriptions of the embodiments of the memory check ASIC have been presented for the purposes of illustration and description. While multiple embodiments of the memory check ASIC are disclosed, other embodiments will become apparent to those skilled in the art from the above detailed description. As will be realized, these embodiments are capable of modifications in various obvious aspects, all without departing from the spirit and scope of the present disclosure. Accordingly, the detailed description is to be regarded as illustrative in nature and not restrictive.

Although embodiments of the memory check ASIC are described in considerable detail, other versions are possible. Therefore, the spirit and scope of the appended claims should not be limited to the description of versions included herein.

Except as stated immediately above, nothing which has been stated or illustrated is intended or should be interpreted to cause a dedication of any component, step, feature, object, benefit, advantage, or equivalent to the public, regardless of whether it is or is not recited in the claims. The scope of protection is limited solely by the claims that now follow, and that scope is intended to be broad as is reasonably consistent with the language that is used in the claims. The scope of protection is also intended to be broad to encompass all structural and functional equivalents.

What is claimed as new and desired to be protected by Letters Patent is set forth in the appended claims:

1. A method for verifying contents of a flash-based memory of a microcontroller for fuzes and safety and arming (S&A) devices using a memory check application-specific integrated circuit (ASIC), said memory check ASIC comprising an ASIC operatively coupled to said microcontroller via at least: a data line, a clock line, and a shutdown line, said method comprising:
    installing a resistor and a capacitor into a resistor terminal and a capacitor terminal of said ASIC, respectively, to configure a predetermined time interval of a timeout period;
    wherein said resistor has a resistance between approximately 0.5 to 5 megaohms; and
    wherein said capacitor has a capacitance between approximately 50 to 250 nanofarads;
    monitoring, by said ASIC, said data line for a serial data in order to obtain a calculated checksum; and
    transmitting a timeout signal by said ASIC via a timeout line when said microcontroller does not transmit said calculated checksum within said predetermined time interval of said timeout period.

2. A method for verifying contents of a flash-based memory of a microcontroller for fuzes and S&A devices using a memory check ASIC, said memory check ASIC comprising an ASIC operatively coupled to said microcontroller via at least: a data line, a clock line, and a shutdown line, said method comprising:
    calculating, by said microcontroller, a checksum associated with said contents of said flash-based memory of said microcontroller;
    communicating a serial data to said ASIC via said data line, said serial data including said calculated checksum;
    monitoring, by said ASIC, said data line for said serial data in order to obtain said calculated checksum;
    comparing, by a digital logic of said ASIC, said calculated checksum with a predetermined checksum to determine whether a checksum mismatch occurs, said checksum mismatch indicating invalid contents within said flash-based memory of said microcontroller; and
    transmitting, by said ASIC via said shutdown line, a shutdown signal to said microcontroller, in response to said determination of said checksum mismatch;
    wherein said ASIC comprises a reset line configured to receive a reset signal to synchronize sampling of said calculated checksum, said reset signal being latched by one or more flip-flop circuits of said digital logic and having a predetermined number of clock cycles.

* * * * *